United States Patent
Sayed et al.

(10) Patent No.: US 12,031,900 B2
(45) Date of Patent: Jul. 9, 2024

(54) CORROSION ANALYSIS USING MAGNETIC FLUX LEAKAGE MEASUREMENTS

(71) Applicant: Halliburton Energy Services, Inc., Houston, TX (US)

(72) Inventors: Sadeed Sayed, Singapore (SG); Ahmed E. Fouda, Pearland, TX (US); Freeman Lee Hill, Magnolia, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 0 days.

(21) Appl. No.: 17/970,873

(22) Filed: Oct. 21, 2022

(65) Prior Publication Data
US 2024/0133796 A1 Apr. 25, 2024

(51) Int. Cl.
| | |
|---|---|
| *G01N 17/00* | (2006.01) |
| *G01N 27/72* | (2006.01) |
| *G01N 27/82* | (2006.01) |
| *G01N 27/90* | (2021.01) |
| *G01R 33/04* | (2006.01) |
| *G01R 33/12* | (2006.01) |

(52) U.S. Cl.
CPC .......... *G01N 17/006* (2013.01); *G01N 27/72* (2013.01); *G01N 27/82* (2013.01); *G01N 27/9046* (2013.01); *G01R 33/04* (2013.01); *G01R 33/12* (2013.01); *G01R 33/1215* (2013.01); *G01R 33/1269* (2013.01)

(58) Field of Classification Search
CPC ...... G01N 17/006; G01N 27/72; G01N 27/82; G01N 27/9046; G01R 33/04; G01R 33/12; G01R 33/1215; G01R 33/1269

USPC .......................................................... 324/228
See application file for complete search history.

(56) References Cited

U.S. PATENT DOCUMENTS

| | | | |
|---|---|---|---|
| 10,551,349 B2 | 2/2020 | Iannucci et al. | |
| 2006/0288756 A1* | 12/2006 | De Meurechy | G01N 21/49 73/1.01 |
| 2010/0324836 A1* | 12/2010 | Ramachandran | G01N 17/006 702/35 |
| 2015/0377012 A1 | 12/2015 | Liu et al. | |
| 2017/0322182 A1 | 11/2017 | Zheng et al. | |

(Continued)

FOREIGN PATENT DOCUMENTS

| | | |
|---|---|---|
| WO | 2022003366 A1 | 1/2022 |

OTHER PUBLICATIONS

Shi, Yan et al., "Theory and Application of Magnetic Flux Leakage Pipeline Detection", Sensors 15, No. 12 (2015); 31036-31055; Published: Dec. 10, 2015.

(Continued)

*Primary Examiner* — Raul J Rios Russo
(74) *Attorney, Agent, or Firm* — NOVAK DRUCE CARROLL LLP

(57) ABSTRACT

Aspects of the subject technology relate to systems, methods, and computer-readable media for corrosion analysis using magnetic flux leakage measurements. The present technology can magnetic flux leakage data obtained by a magnetic flux leakage tool placed in a pipe within a wellbore and convert the magnetic flux leakage data into image data. Further, the present technology can provide the image data to a machine learning model. The machine learning model is configured to identify one or more physical parameters associated with corrosion present on the pipe.

20 Claims, 8 Drawing Sheets

(56) References Cited

U.S. PATENT DOCUMENTS

| | | | |
|---|---|---|---|
| 2019/0226322 A1* | 7/2019 | Khalaj Amineh | G01V 3/28 |
| 2021/0018425 A1* | 1/2021 | Alanazi | G01N 17/043 |
| 2021/0238991 A1* | 8/2021 | Shand | G01R 33/0011 |

OTHER PUBLICATIONS

Abstract of Lu, Senxiang et al., "An Estimation Method of Defect Size From MFL Image Using Visual Transformation Convolutional Neural Network," in IEEE Transactions on Industrial Informatics, vol. 15, No. 1, pp. 213-224, Jan. 2019, doi: 10.1109/TII.2018.2828811.

International Search Report & Written Opinion; PCT Application No. PCT/US2023/027980; mailed Nov. 7, 2023.

* cited by examiner

CORROSION ANALYSIS USING MAGNETIC FLUX LEAKAGE MEASUREMENTS

TECHNICAL FIELD

The present technology relates to solutions for analyzing corrosion in pipes, and more particularly, to the use of magnetic flux leakage measurements in machine learning to analyze and estimate corrosion in pipes in a well bore.

BACKGROUND

In the excavation of an oil well, a number of pipes are embedded in the well and thus the wall of the well is prevented from crumbling. More specifically, a hole is excavated by drilling until a certain or desired depth is reached, and thereafter, a pipe is inserted into the excavated well in order to prevent the crumbling of the wall of the well. However, due to the presence of high pressure and contact with corrosive fluids, pipes that are used in the oil well can be prone to corrosion.

BRIEF DESCRIPTION OF THE DRAWINGS

In order to describe the manner in which the features and advantages of this disclosure can be obtained, a more particular description is provided with reference to specific examples and aspects thereof which are illustrated in the appended drawings. Understanding that these drawings depict only exemplary examples and aspects of the disclosure and are not therefore to be considered to be limiting of its scope, the principles herein are described and explained with additional specificity and detail through the use of the accompanying drawings.

DETAILED DESCRIPTION

Figure 1A:
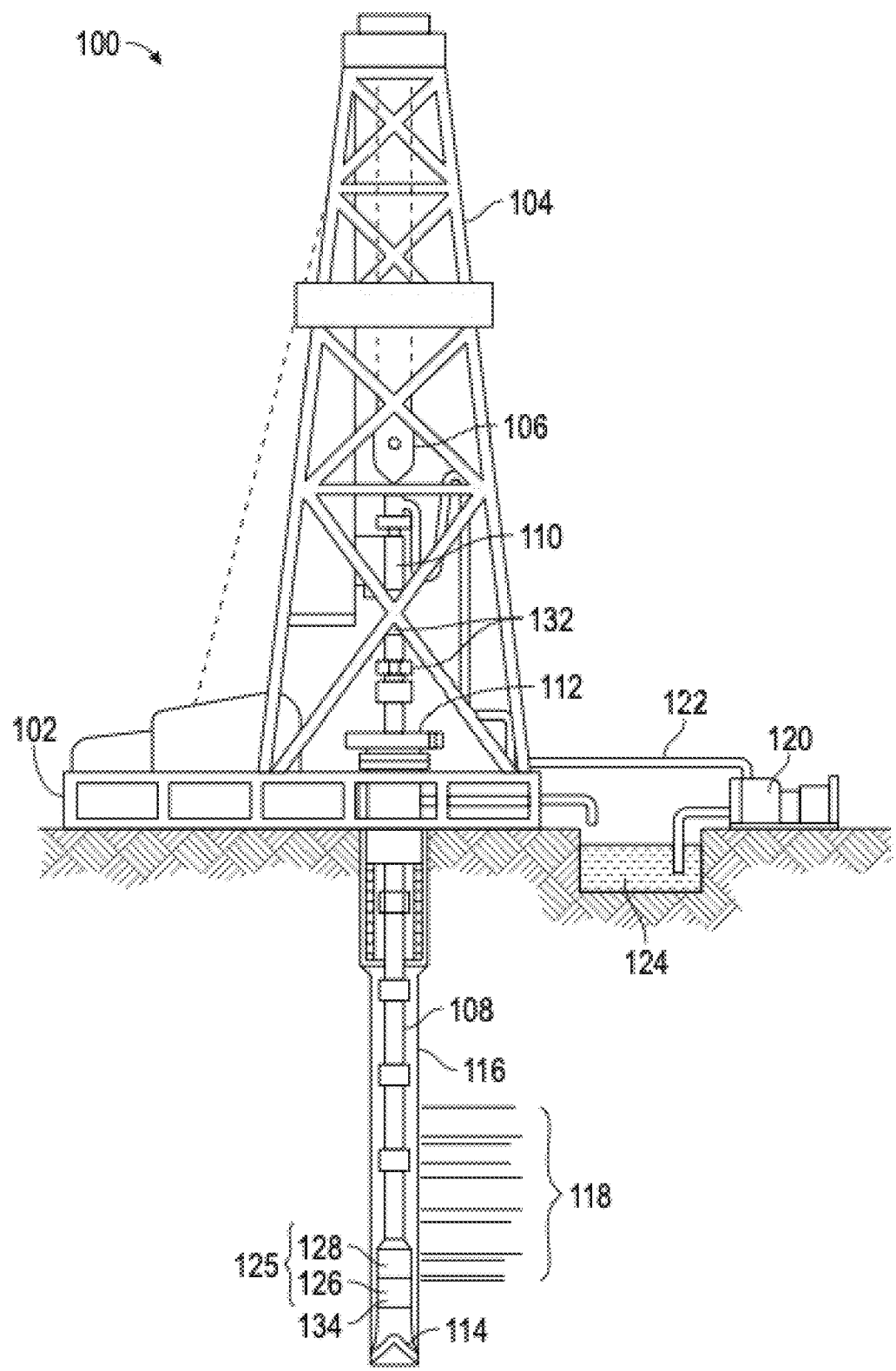
FIG. 1A is a schematic diagram of an example logging while drilling wellbore operating environment, in accordance with various aspects of the subject technology.

Various examples and aspects of the disclosure are discussed in detail below. While specific implementations are discussed, it should be understood that this is done for illustration purposes only. A person skilled in the relevant art will recognize that other components and configurations may be used without parting from the spirit and scope of the disclosure.

Additional features and advantages of the disclosure will be set forth in the description which follows, and in part will be obvious from the description, or can be learned by practice of the principles disclosed herein. The features and advantages of the disclosure can be realized and obtained by means of the instruments and combinations particularly pointed out in the appended claims. These and other features of the disclosure will become more fully apparent from the following description and appended claims or can be learned by the practice of the principles set forth herein.

It will be appreciated that for simplicity and clarity of illustration, where appropriate, reference numerals have been repeated among the different figures to indicate corresponding or analogous elements. In addition, numerous specific details are set forth in order to provide a thorough understanding of the examples and aspects described herein. However, it will be understood by those of ordinary skill in the art that the examples and aspects described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the examples and aspects described herein.

As mentioned, casings or pipes (typically metallic pipes) that are used in oil well need to withstand high temperature, pressure, and humidity due to the nature of the oil well operation. Over time, these factors can contribute to the corrosion of the metallic pipes. As follows, to maintain the integrity of the oil well and properly maintain the oil well, operators need to accurately and timely detect and estimate the corrosion (i.e., parameters of the metal loss on the pipes) and other metallic deformation on the pipes.

Some magnetic flux leakage (MFL) tools can be calibrated to defects that are circular or have equal aspect ratios (e.g., holes and pitting). However, those MFL tools tend to lose accuracy for elongated effects (e.g., slots) due to the large variation in magnetic flux distribution from the calibration scenario. In other words, the elongated size of defects can impact the amplitude of the signals that are measured by sensors of the MFL tools. Therefore, it is challenging to calibrate MFL tools to a wide range of defects that might have different sizes, shapes, aspect ratios, and penetrations.

Furthermore, MFL measurements of the MFL tools require a large number of analyses, which can be complicated and largely depends on the experience and expertise of operators, especially for non-linear data results from defects that have different aspect ratios, shapes, or sizes. This can result in a time-consuming and laborious process of interpreting the MFL measurements and estimating the corrosion.

Therefore, there exists a need for systems and techniques that can identify and estimate the corrosion on either side (inside and/or outside) of the pipes in real-time and in a non-invasive matter. Further, there exists a need for systems and techniques that can be calibrated to defects that might have not only equal aspect ratios but also elongated defects.

The present technology includes systems, methods, and computer-readable media for solving these problems and discrepancies, among others. In some examples, systems, methods, and computer-readable media are provided for a machine learning process of magnetic flux leakage measurement data to analyze corrosion present on a pipe in an oil well. As follows, the machine learning model can identify one or more physical parameters associated with corrosion present on the pipe (e.g., a defect circumferential width, a defect axial length, a detect penetration, a volume of metal loss, etc.). A machine learning process described herein can accurately estimate the physical parameters of a wide variety of defects with different sizes, aspect ratios, and penetration based on magnetic flux leakage tool measurements. As follows, the present technology can help operators accurately detect and identify corrosion in real-time and therefore reduce the maintenance costs of an oil well. A real-time can include actual time, virtually immediately, or within a threshold range to actual time.

To illustrate, the physical parameters of the corrosion on a pipe can be estimated accurately with a high degree of resolution in both azimuth and axial directions via a machine learning process. Additionally, anomalies (e.g., defects due to corrosion in pipes) can be automatically identified from a raw data image. The image can be also segmented to estimate the physical properties of each defect (e.g., corrosion or material loss one at a time. Further, features can be extracted automatically from the raw data image, via a machine learning process, based on magnetic flux leakage measurements without user intervention.

In various examples and aspects, a method includes receiving magnetic flux leakage data obtained by a magnetic flux leakage tool placed in a pipe within a wellbore, converting the magnetic flux leakage data into image data, and providing the image data to a machine learning model, which is configured to identify one or more physical parameters associated with corrosion present on the pipe. Further, the method includes outputting, via the machine learning model with the image data as input, the one or more physical parameters associated with the corrosion. In some cases, the machine learning model is a regression model.

The physical parameters associated with the corrosion include a defect circumferential width, a defect axial length, a detect penetration, a volume of metal loss, and a combination thereof.

Furthermore, providing the image data to a machine learning model can include identifying at least one anomaly in the image data; determining one or more features associated with the at least one anomaly; and providing the one or more features associated with the at least one anomaly to the machine learning model. Also, the one or more features associated with the at least one anomaly include at least one of an anomaly circumferential width, an anomaly axial length, a peak deflection from a baseline, width and length in a percentile, and an anomaly contour length.

Additionally, the method includes providing the physical parameters outputted by the machine learning model into a second machine learning model to identify a second physical parameter associated with the corrosion.

Also, the method includes providing measurement parameters to the machine learning model, wherein the measurement parameters include at least one of an inner indicator, an outer indicator, a logging direction, an outside diameter (OD) of the pipe, an inside diameter (ID) of the pipe, a logging speed, and an eccentricity between the pipe and another outer pipe.

In some examples, the magnetic flux leakage tool comprises a magnet configured to magnetize the pipe and one or more magnetic field sensors disposed along a circumference of the pipe and configured to measure flux leakage.

In some cases, the magnetic flux leakage tool comprises a magnet configured to at least partially saturate the pipe and one or more eddy current sensors disposed along a circumference of the pipe and configured to measure secondary magnetic fields generated by eddy currents.

Additionally, the image data is a 2-dimensional measurement of a circumference of the pipe with respect to a measured depth of the pipe.

Furthermore, the machine learning model comprises a plurality of machine learning models, wherein each of the plurality of machine learning models is configured to identify one of the one or more physical parameters associated with the corrosion. Also, the machine learning model is trained with training data including at least one of data obtained through logging a test fixture, simulation data from a test fixture, and data obtained through logging a field log.

In various examples and aspects, a system comprises one or more processors and at least one computer-readable storage medium having stored therein instructions. The instructions, which when executed by the one or more processors, can cause the one or more processors to receive magnetic flux leakage data obtained by a magnetic flux leakage (MFL) tool placed in a pipe within a wellbore, convert the magnetic flux leakage data into image data, and provide the image data to a machine learning model, which is configured to identify one or more physical parameters associated with corrosion present on the pipe.

In various examples and aspects, a non-transitory computer-readable storage medium having stored therein instructions which, when executed by one or more processors, cause the one or more processors to receive magnetic flux leakage data obtained by a magnetic flux leakage (MFL) tool placed in a pipe within a wellbore, convert the magnetic flux leakage data into image data, and provide the image data to a machine learning model, which is configured to identify one or more physical parameters associated with corrosion present on the pipe.

Turning now to FIG. 1A, a drilling arrangement is shown that exemplifies a Logging While Drilling (commonly abbreviated as LWD) configuration in a wellbore drilling scenario 100. Logging-While-Drilling typically incorporates sensors that acquire formation data. Specifically, the drilling arrangement shown in FIG. 1A can be used to gather formation data through an electromagnetic pipe inspection tool as part of logging the wellbore using the electromagnetic pipe inspection tool. The drilling arrangement of FIG. 1A also exemplifies what is referred to as Measurement While Drilling (commonly abbreviated as MWD) which utilizes sensors to acquire data from which the wellbore's path and position in three-dimensional space can be determined. FIG. 1A shows a drilling platform 102 equipped with a derrick 104 that supports a hoist 106 for raising and lowering a drill string 108. The hoist 106 suspends a top drive 110 suitable for rotating and lowering the drill string 108 through a well head 112. A drill bit 114 can be connected to the lower end of the drill string 108. As the drill bit 114 rotates, it creates a wellbore 116 that passes through various subterranean formations 118. A pump 120 circulates drilling fluid through a supply pipe 122 to top drive 110, down through the interior of drill string 108 and out orifices in drill bit 114 into the wellbore. The drilling fluid returns to the surface via the annulus around drill string 108, and into a retention pit 124. The drilling fluid transports cuttings from the wellbore 116 into the retention pit 124 and the drilling fluid's presence in the annulus aids in maintaining the integrity of the wellbore 116. Various materials can be used for drilling fluid, including oil-based fluids and water-based fluids.

Logging tools 126 can be integrated into the bottom-hole assembly 125 near the drill bit 114. As the drill bit 114 extends the wellbore 116 through the formations 118, logging tools 126 collect measurements relating to various formation properties as well as the orientation of the tool and various other drilling conditions. The bottom-hole assembly 125 may also include a telemetry sub 128 to transfer measurement data to a surface receiver 132 and to receive commands from the surface. In at least some cases, the telemetry sub 128 communicates with a surface receiver 132 using mud pulse telemetry. In some instances, the telemetry sub 128 does not communicate with the surface, but rather stores logging data for later retrieval at the surface when the logging assembly is recovered.

Each of the logging tools 126 may include one or more tool components spaced apart from each other and communicatively coupled by one or more wires and/or other communication arrangement. The logging tools 126 may also include one or more computing devices communicatively coupled with one or more of the tool components. The one or more computing devices may be configured to control or monitor a performance of the tool, process logging data, and/or carry out one or more aspects of the methods and processes of the present disclosure.

In at least some instances, one or more of the logging tools 126 may communicate with a surface receiver 132 by a wire, such as wired drill pipe. In other cases, the one or more of the logging tools 126 may communicate with a surface receiver 132 by wireless signal transmission. In at least some cases, one or more of the logging tools 126 may receive electrical power from a wire that extends to the surface, including wires extending through a wired drill pipe.

Collar 134 is a frequent component of a drill string 108 and generally resembles a very thick-walled cylindrical pipe, typically with threaded ends and a hollow core for the conveyance of drilling fluid. Multiple collars 134 can be included in the drill string 108 and are constructed and intended to be heavy to apply weight on the drill bit 114 to assist the drilling process. Because of the thickness of the collar's wall, pocket-type cutouts or other type recesses can be provided into the collar's wall without negatively impacting the integrity (strength, rigidity and the like) of the collar as a component of the drill string 108.

Figure 1B:
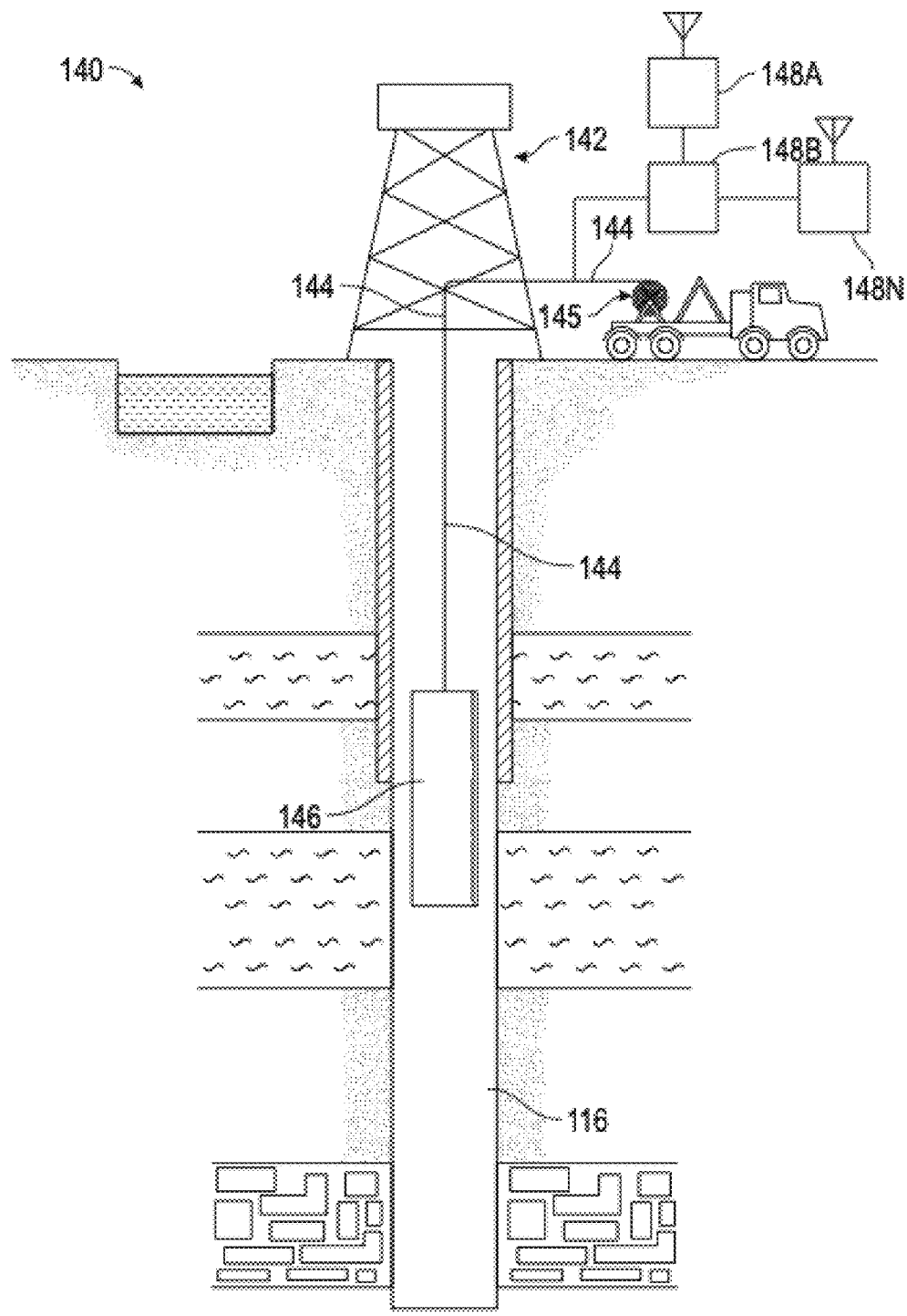
FIG. 1B is a schematic diagram of an example downhole environment having tubulars, in accordance with various aspects of the subject technology.

Referring to FIG. 1B, an example system 140 is depicted for conducting downhole measurements after at least a portion of a wellbore has been drilled and the drill string removed from the well. An electromagnetic pipe inspection tool can be operated in the example system 140 shown in FIG. 1B to log the wellbore. A downhole tool is shown having a tool body 146 in order to carry out logging and/or other operations. For example, instead of using the drill string 108 of FIG. 1A to lower tool body 146, which can contain sensors and/or other instrumentation for detecting and logging nearby characteristics and conditions of the wellbore 116 and surrounding formations, a wireline conveyance 144 can be used. The tool body 146 can be lowered into the wellbore 116 by wireline conveyance 144. The wireline conveyance 144 can be anchored in the drill rig 142 or by a portable means such as a truck 145. The wireline conveyance 144 can include one or more wires, slicklines, cables, and/or the like, as well as tubular conveyances such as coiled tubing, joint tubing, or other tubulars.

The illustrated wireline conveyance 144 provides power and support for the tool, as well as enabling communication between data processors 148A-N on the surface. In some examples, the wireline conveyance 144 can include electrical and/or fiber optic cabling for carrying out communications. The wireline conveyance 144 is sufficiently strong and flexible to tether the tool body 146 through the wellbore 116, while also permitting communication through the wireline conveyance 144 to one or more of the processors 148A-N, which can include local and/or remote processors. Moreover, power can be supplied via the wireline conveyance 144 to meet power requirements of the tool. For slickline or coiled tubing configurations, power can be supplied downhole with a battery or via a downhole generator.

Figure 2:
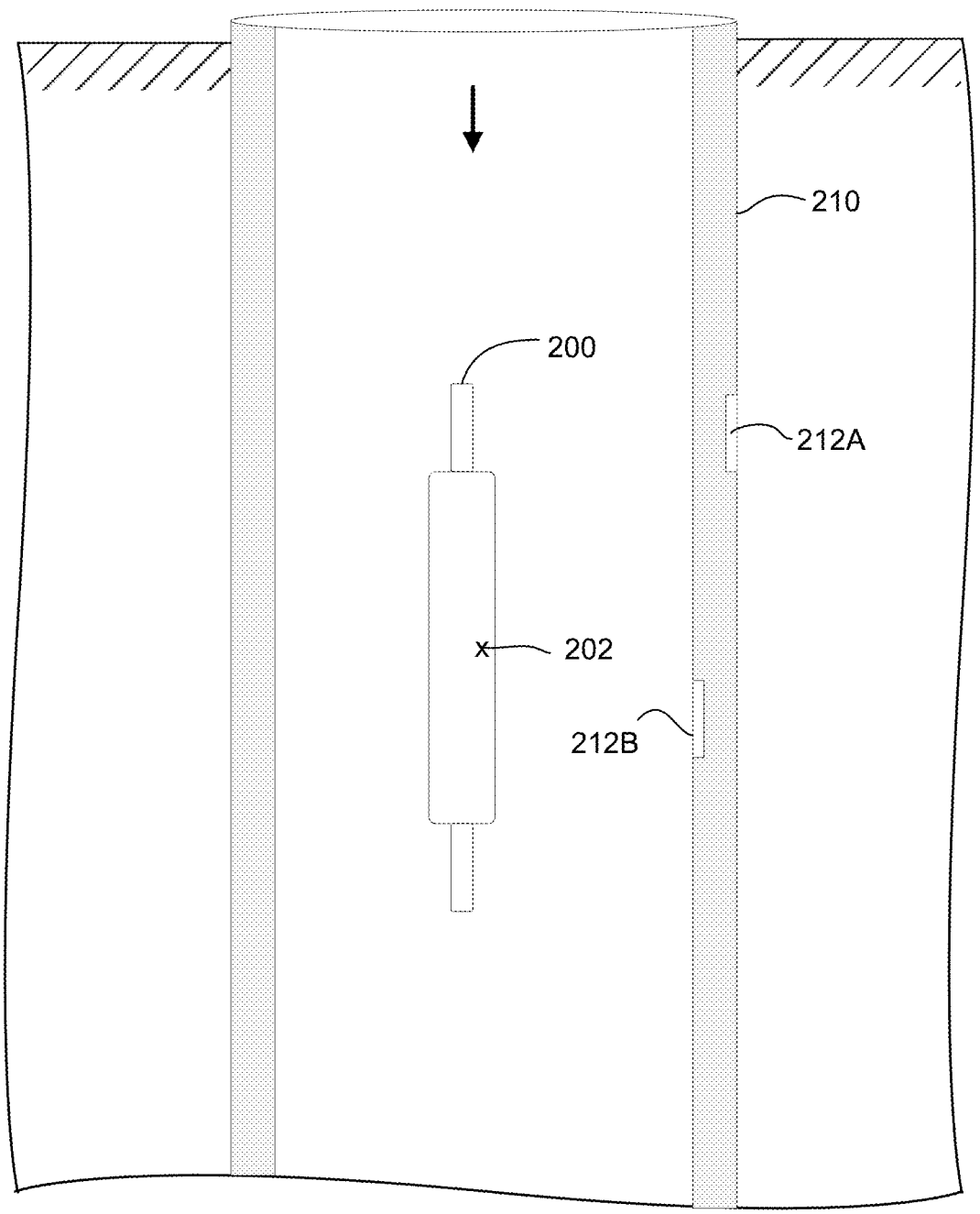
FIG. 2 shows an example of a magnetic flux leakage tool placed in a well, in accordance with various aspects of the subject technology.

FIG. 2 illustrates an example of a magnetic flux leakage (MFL) tool 200 placed in a well (e.g., as part of a logging tool, or an electromagnetic inspection tool as illustrated with respect to FIGS. 1A and 1B) to magnetize and/or at least partially saturate a pipe 210 (e.g., a metallic tubular, a casing). More specifically, MFL tool 200 uses a magnet (e.g., permanent or electromagnetic) to magnetize and/or at least partially saturate pipe 210. Under the normal condition of clean pipe 210, there is no change in the magnetic field that is caused by the magnet of MFL tool 200. However, in the case of defect 212A or 212B (collectively, defect 212) such as corrosion or material loss, magnetic resistance can be developed by defect 212 due to the low permeability of defect 212 as compared to the material of pipe 210. As follows, the magnetic field is disturbed or "leaks" from pipe 210 at a spot or place that has defect 212. This magnetic flux leakage is detected by an array of sensors (e.g., sensor 202) that are placed along the circumference of pipe 210.

In some examples, sensor 202 can measure the primary or the secondary magnetic field intensities and provide information associated with defect 212 such as detection of the presence of defect 212 and metal thickness of pipe 210 (e.g., loss of thickness due to defect 212 such as corrosion). More specifically, sensor 202 can measure the three-dimensional vector of the leakage field (e.g., axial, radial, and circumferential components). As follows, MFL tool 200 can provide information regarding the presence of different types of defect 212 in the circumferential and axial directions of pipe 210 (e.g., holes, pitting, cracks, cavities, shrinkage, etc.). The array of sensors can include a magnetic field sensor, which is configured to measure flux leakage and/or an eddy current sensor, which is configured to measure secondary magnetic fields generated by eddy currents. The sensors (e.g., magnetic field sensors and/or eddy current sensors) can be azimuthally distributed along the circumference of pipe 210. In other words, multiple sensors can be deployed around the azimuth of pipe 210 to cover the circumference of pipe 210. Any applicable number of sensors (e.g., up to 100 or more) can be included in MFL tool 200.

In some aspects, MFL tool 200 travels the depth of the well downwards (or upwards) to detect one or more defects (e.g., defect 212) on pipe 210 in the well. The information based on the measurements by the array of sensors (e.g., sensor 202) can include two-dimensional image data where the horizontal direction corresponds to the array of sensors along the circumference of pipe 210 and the vertical direction corresponds to the depth of the well where pipe 210 is placed (or where MFL tool 200 has traveled).

Figure 3:
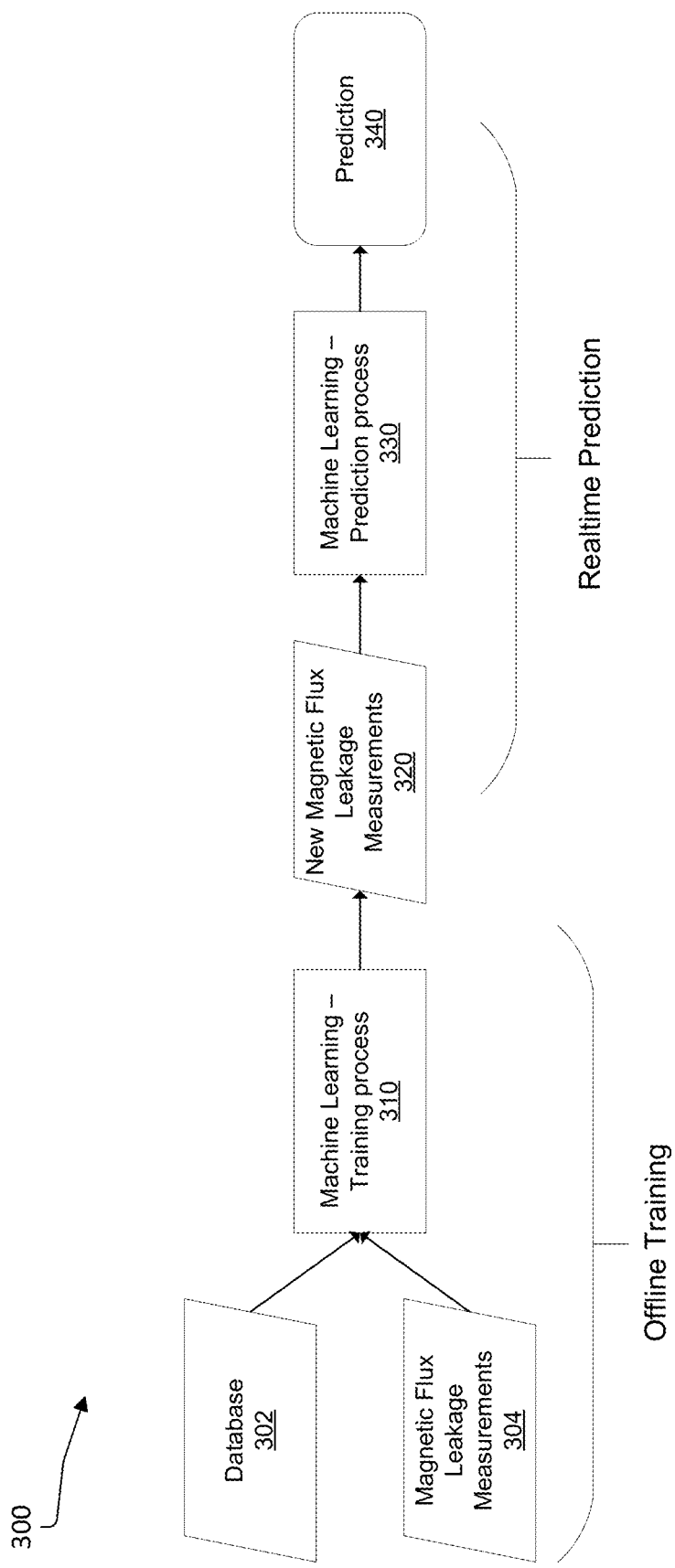
FIG. 3 shows an example of a corrosion estimation system, in accordance with various aspects of the subject technology.

FIG. 3 illustrates an example block diagram of a corrosion estimation system 300. During an offline training phase, system 300 can receive, from database 302, data associated with multiple types of corrosion that are detected/identified in various pipes. For example, such data can be collected through logging a test fixture, a simulation from a test fixture, and/or logging a field log and matched to ground truth data. Reference physical parameters of the defects (e.g., corrosion) can be obtained using reference tools such as ultrasound or mechanical calipers.

Further, system 300 can receive corresponding magnetic flux leakage (MFL) measurements 304 (e.g., MFL measurements from multiple types of corrosion in various pipes). For example, MFL measurements 304 are obtained by a magnetic flux leakage tool (e.g., MFL tool 200 as illustrated in FIG. 2) placed in a pipe within a wellbore.

In some aspects, system 300 can provide data from database 302 and MFL measurements 304 to a machine learning algorithm/model (block 310) to train a machine learning model such as a regression model. More specifically, the machine learning model can be trained to estimate/predict physical parameters associated with corrosion present in pipes based on the input data (e.g., data from database 302 and MFL measurements 304).

A large volume of training data that has been collected from several kinds of corrosion and corresponding MFL measurements can be used to train the model to output an accurate and reliable prediction of physical parameters relating to corrosion present on the pipe. Examples of the machine learning model can include, without limitations, a regression model, a decision tree model, a deep neural network, and a regression chain.

In some cases, a machine learning model is trained with training data that includes features extracted from a test defect and matched to the ground truth. As follows, a machine learning model can generate an output or prediction that is substantially identical or close to the ground truth.

To illustrate an example of an offline training phase, data associated with 100 known defects (e.g., corrosion) can be collected, for example, through logging a test fixture, a simulation from a test fixture, and/or logging a field log. Only a certain percentage of the defects (e.g., 80% of known defects) can be used as training data and the rest can be used for testing to validate the training.

Moreover, in some aspects, an individual machine learning model can be trained for each of the physical parameters that can be outputted/predicted by the machine learning model. In other words, a single machine learning model is trained for one of the unknown physical parameters.

During a real-time prediction phase, system 300 can receive or collect measurement parameters (e.g., profile data) such as an inner indicator, an outer indicator, a logging direction, an outside diameter (OD) of the pipe, an inside diameter (ID) of the pipe, a logging speed, an eccentricity between the pipe and another outer pipe, etc. In some cases, measurement parameters (e.g., profile data) can be gathered a priori, for example, before logging a pipe in a well.

Further, system 300 can receive new magnetic flux leakage (MFL) measurements 320 that are obtained by an MFL tool (e.g., MFL tool 200 as illustrated in FIG. 2). In some examples, new MFL measurements 320 comprise an indicator of the side of the pipe (e.g., inside or outside) where a defect is located (e.g., outer defect 212A or inner defect 212B as illustrated in FIG. 2).

In some aspects, system 300 can convert new MFL measurement 320 into image data. For example, new MFL measurement 320 can be stored in the form of a 2-dimensional (2-D) image. The 2-D image represents a 2-D measurement of the circumference of the pipe with respect to a measured depth of the pipe. More specifically, in the 2-D image, the horizontal axis corresponds to a different sensor measurement along the circumference of the pipe and the vertical axis corresponds to the depth of the well (e.g., a depth that the magnetic flux leakage tool has traveled in the wellbore). A manual analysis or interpretation of the 2-D image data can be challenging since there is no linear or one-to-one relationship between the size or the contrast of anomalies (e.g., indicators of corrosion) and actual defects (e.g., corrosion).

In some cases, system 300 can provide new MFL measurements 320 (e.g., in the form of a 2-D image) along with measurement parameters (e.g., profile data) to the machine learning model that has been trained at block 310. The machine learning model is configured to identify one or more physical parameters associated with corrosion present on the pipe. As noted, examples of a machine learning model can include, without limitations, a regression model, a decision tree model, a deep neural network, and a regression chain.

In some aspects, a machine learning model (as part of the machine learning-prediction process at block 330) can identify at least one anomaly in the image data. For example, a contouring method can be used to find and locate the anomaly. Also, a segmentation method can be used to separate individual anomalies. Further, a machine learning model can determine one or more features associated with the anomaly such as an anomaly circumferential width, an anomaly axial length, a peak deflection from a baseline, width and length in a percentile, mean deflection from a baseline, and an anomaly contour length. As an example of the different percentile width of the image (e.g., a 90% width), a peak of an anomaly on the image can be found and a 90% width of the peak can be measured, which indicates that the signal level drops to 90% of the maximum. This width can be measured both axially and/or circumferentially.

In some examples, based on new MFL measurements 320, a machine learning model can identify and generate prediction 340 such as physical parameters associated with corrosion present on the pipe (block 330). Examples of the physical parameters that can be generated/predicted by the machine learning model (e.g., prediction 340) include, without limitations, a defect circumferential width (e.g., width of the corrosion), a defect axial length (e.g., height of the corrosion), a defect penetration (e.g., thickness of the corrosion), a volume of metal loss, etc.

Further, system 300 can provide prediction 340 to another machine learning model to identify another physical parameter associated with the corrosion, which has not been identified/predicted during the machine learning-prediction process at block 330. In other words, an output of a first machine learning model can be provided as input to a second machine learning model and so on (e.g., feeding the output of a machine learning model to another machine model as input) to obtain a machine learning chain (e.g., regression chain).

Additionally, at the time of application (e.g., application of an MFL tool into a pipe), the MFL tool can be lowered into a well to obtain MFL measurements at each depth. The MFL measurements can be used to estimate the physical parameters of the corrosion in real time. More specifically, the prediction (e.g., prediction 340) of the physical parameters can be performed in real-time if the MFL measurements can be provided and available in real-time. A short buffer (e.g., 0.25 ft, 0.5 ft, 1 ft, 5 ft) may be needed to compose a 2-D image and provide the 2-D image to the machine learning model (e.g., in machine learning-prediction process 330).

Moreover, the physical parameters (e.g., prediction 340) generated/predicted by the machine learning model can be provided to operators, for example, on a display so that operators can plan and take remedial action based on the physical parameters accordingly.

Figure 4:
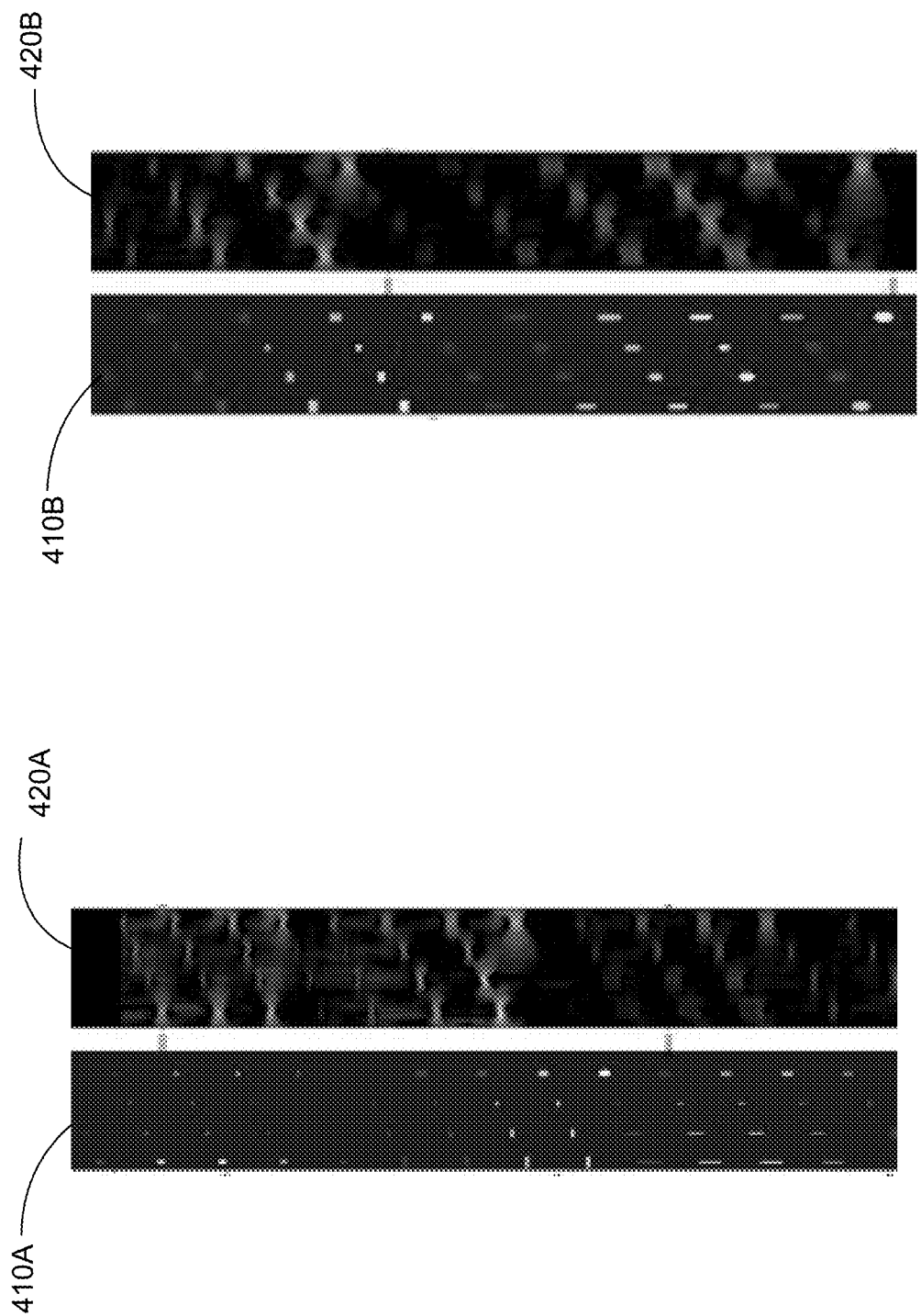
FIGS. 4A and 4B illustrate an example of 2-D image based on ground truth data and magnetic flux measurement data, in accordance with various aspects of the subject technology.

FIGS. 4A and 4B illustrate example 2-D images based on ground truth data 410A and 410B. Further, FIGS. 4A and 4B illustrate examples 2-D images based on magnetic flux measurement data 420A and 420B in comparison to 2-D images based on ground truth data 410A and 410B, respectively.

As described, system 300 as illustrated in FIG. 3 can convert magnetic flux leakage measurement data (e.g., MFL measurements 304 and/or new MFL measurement 320 as illustrated in FIG. 3) into image data representing a 2-D image (e.g., 2-D images 420A and 420B) of MFL measurements of a circumference of the pipe with respect to a measured depth of the pipe. More specifically, a horizontal axis of images 420A and 420B corresponds to the different sensor measurements along the circumference (e.g., MFL measurements obtained by sensor 202 of MFL tool 200). A vertical axis of images 420A and 420B corresponds to the axis of the pipe (e.g., pipe 210 as illustrated in FIG. 2).

As shown in 2-D images based on ground truth data 410A and 410B, multiple patches on the images denote different penetration depths of the corrosion. Corresponding 2-D images based on MFL measurement data 420A and 420B include various patches (e.g., anomalies), which indicate the presence of thickness variation due to corrosion or other physical deformations (e.g., material loss). In some cases, 2-D images based on MFL measurement data 420A and 420B can be illustrated as monochromatic images where the anomalies can be shown as bright or white spots. The comparison between 2-D images based on ground data and 2-D images based on MFL measurement data shows a good match as to where corrosion on the pipe is detected/located.

Further, based on 2-D images based on MFL measurement data 420A and 420B, a number of parameters can be estimated such as circumferential width, anomaly axial length, peak deflection from a baseline, 80/50/30/20/10-percentile width/length, anomaly contour length, etc.

Figure 5:
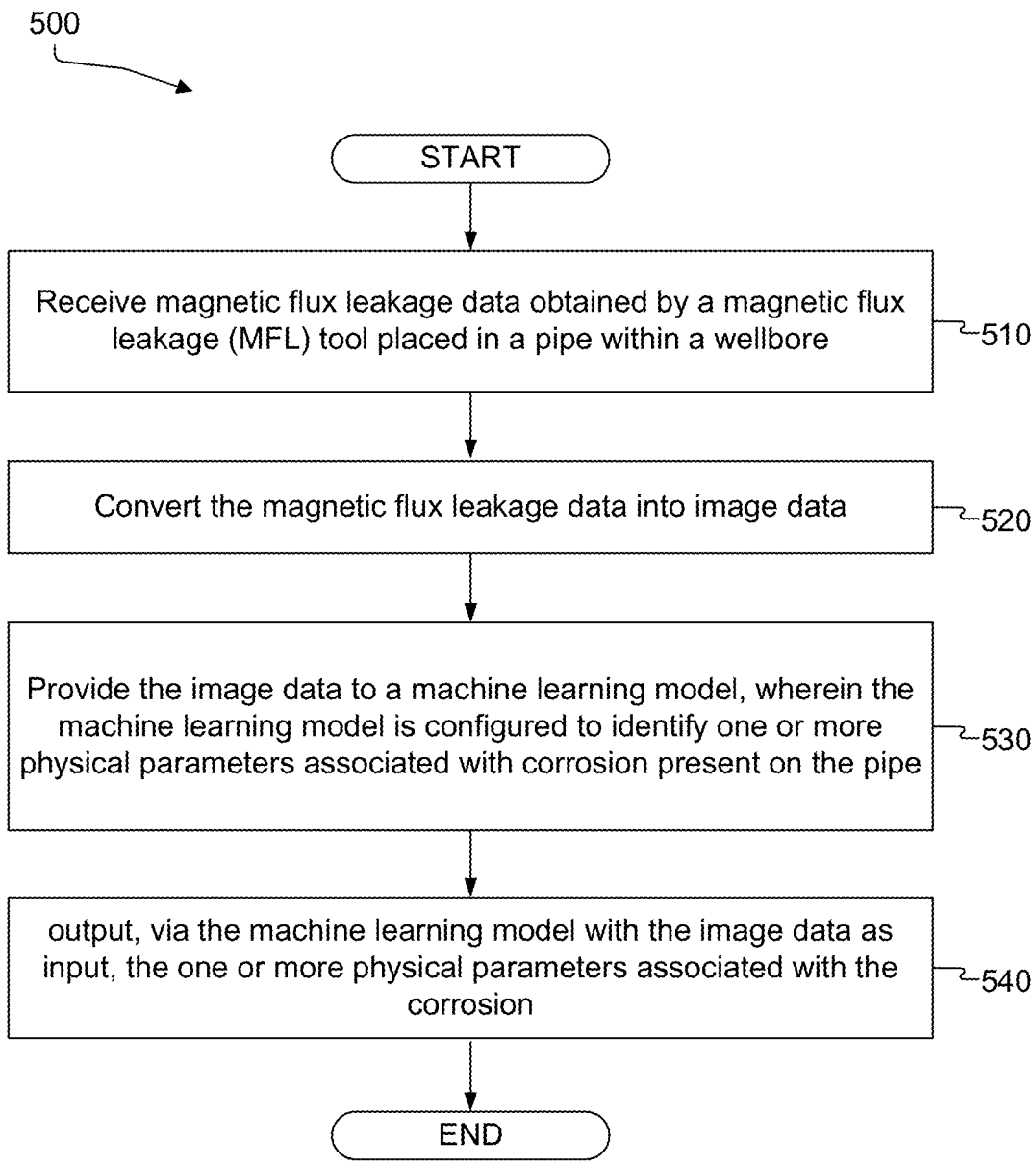
FIG. 5 illustrates an example process for analyzing and estimating corrosion in pipes through machine learning based on magnetic flux leakage measurements, in accordance with various aspects of the subject technology.

FIG. 5 shows an example process 500 of analyzing and estimating corrosion in pipes through machine learning based on magnetic flux leakage measurements, in accordance with various aspects of the subject technology. Although the example process 500 depicts a particular sequence of operations, the sequence may be altered without departing from the scope of the present disclosure. For example, some of the operations depicted may be performed in parallel or in a different sequence that does not materially affect the function of the process 500. In other examples, different components of an example device or system that implements the process 500 may perform functions at substantially the same time or in a specific sequence.

At step 510, process 500 includes receiving magnetic flux leakage data obtained by a magnetic flux leakage tool placed in a pipe within a wellbore. For example, system 300 as illustrated in FIG. 3 can receive MFL measurements 304, which can be obtained/measured by MFL tool 200 placed in pipe 210 within a wellbore as illustrated in FIG. 2.

At step 520, process 500 includes converting the magnetic flux leakage data into image data. For example, the image data can include a 2-D image (e.g., 2-D images 420A and 420B as shown in FIGS. 4A and 4B) representing measurement of a circumference of a pipe with respect to a measured depth of the pipe.

At step 530, process 500 includes providing the image data to a machine learning model, which is configured to identify one or physical parameters associated with corrosion present on the pipe. For example, system 300 can provide the image data to a machine learning model (e.g., block 330), which is configured to generate prediction 340 such as physical parameters associated with corrosion present on the pipe. Examples of the physical parameters can include, without limitations, a defect circumferential width, a defect axial length, a detect penetration, and a volume of metal loss.

At step 540, process 500 includes outputting, via the machine learning model with the image data as input, the one or more physical parameters associated with the corrosion. For example, through machine learning-prediction process 330 as illustrated in FIG. 3, a machine learning model can generate prediction 340 including physical parameters associated with corrosion present on the pipe.

Figure 6:
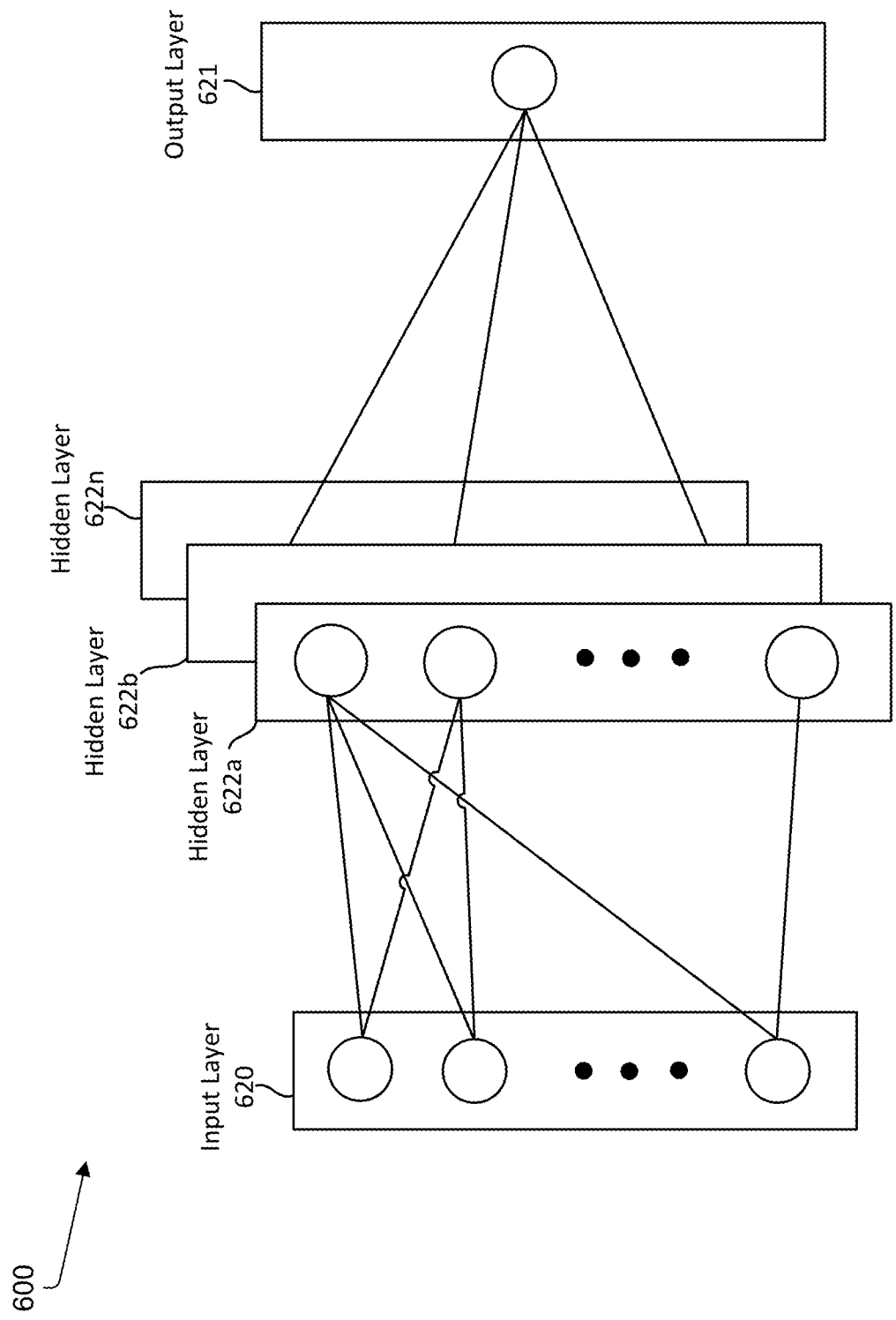
FIG. 6 illustrates an example of a deep learning neural network that can be used in corrosion estimation and analysis process, according to some aspects of the disclosed technology.

In FIG. 6, the disclosure now turns to a further discussion of models (e.g., machine learning models as illustrated with respect to FIG. 3) that can be used through the environments and techniques described herein. FIG. 6 is an example of a deep learning neural network 600 that can be used to implement all or a portion of the systems and techniques described herein (e.g., neural network 600 can be used to implement a perception module (or perception system) as discussed above). An input layer 620 can be configured to receive sensor data. The neural network 600 includes multiple hidden layers 622a, 622b, through 622n. The hidden layers 622a, 622b, through 622n include "n" number of hidden layers, where "n" is an integer greater than or equal to one. The number of hidden layers can be made to include as many layers as needed for the given application. The neural network 600 further includes an output layer 621 that provides an output resulting from the processing performed by the hidden layers 622a, 622b, through 622n. In one illustrative example, the output layer 621 can provide estimated treatment parameters, that can be used/ingested by a differential simulator to estimate a patient treatment outcome.

The neural network 600 is a multi-layer neural network of interconnected nodes. Each node can represent a piece of information. Information associated with the nodes is shared among the different layers and each layer retains information as information is processed. In some cases, the neural network 600 can include a feed-forward network, in which case there are no feedback connections where outputs of the network are fed back into itself. In some cases, the neural network 600 can include a recurrent neural network, which can have loops that allow information to be carried across nodes while reading in input.

Information can be exchanged between nodes through node-to-node interconnections between the various layers. Nodes of the input layer 620 can activate a set of nodes in the first hidden layer 622a. For example, as shown, each of the input nodes of the input layer 620 is connected to each of the nodes of the first hidden layer 622a. The nodes of the first hidden layer 622a can transform the information of each input node by applying activation functions to the input node information. The information derived from the transformation can then be passed to and can activate the nodes of the next hidden layer 622b, which can perform their own designated functions. Example functions include convolutional, up-sampling, data transformation, and/or any other suitable functions. The output of the hidden layer 622b can then activate nodes of the next hidden layer, and so on. The output of the last hidden layer 622n can activate one or more nodes of the output layer 621, at which an output is provided. In some cases, while nodes in the neural network 600 are shown as having multiple output lines, a node can have a single output and all lines shown as being output from a node represent the same output value.

In some cases, each node or interconnection between nodes can have a weight that is a set of parameters derived from the training of the neural network 600. Once the neural network 600 is trained, it can be referred to as a trained neural network, which can be used to classify one or more activities. For example, an interconnection between nodes can represent a piece of information learned about the interconnected nodes. The interconnection can have a tunable numeric weight that can be tuned (e.g., based on a training dataset), allowing the neural network 600 to be adaptive to inputs and able to learn as more and more data is processed.

The neural network 600 is pre-trained to process the features from the data in the input layer 620 using the different hidden layers 622a, 622b, through 622n in order to provide the output through the output layer 621.

In some cases, the neural network 600 can adjust the weights of the nodes using a training process called backpropagation. A backpropagation process can include a forward pass, a loss function, a backward pass, and a weight update. The forward pass, loss function, backward pass, and parameter/weight update is performed for one training iteration. The process can be repeated for a certain number of iterations for each set of training data until the neural network 600 is trained well enough so that the weights of the layers are accurately tuned.

To perform training, a loss function can be used to analyze error in the output. Any suitable loss function definition can be used, such as a Cross-Entropy loss. Another example of a loss function includes the mean squared error (MSE), defined as $E\_total=\Sigma(½(target-output)^2)$. The loss can be set to be equal to the value of E_total.

The loss (or error) will be high for the initial training data since the actual values will be much different than the predicted output. The goal of training is to minimize the amount of loss so that the predicted output is the same as the training output. The neural network 600 can perform a backward pass by determining which inputs (weights) most contributed to the loss of the network, and can adjust the weights so that the loss decreases and is eventually minimized.

The neural network 600 can include any suitable deep network. One example includes a Convolutional Neural Network (CNN), which includes an input layer and an output layer, with multiple hidden layers between the input and out layers. The hidden layers of a CNN include a series of convolutional, nonlinear, pooling (for downsampling), and fully connected layers. The neural network 600 can include any other deep network other than a CNN, such as an autoencoder, Deep Belief Nets (DBNs), Recurrent Neural Networks (RNNs), among others.

As understood by those of skill in the art, machine-learning based classification techniques can vary depending on the desired implementation. For example, machine-learning classification schemes can utilize one or more of the following, alone or in combination: hidden Markov models; RNNs; CNNs; deep learning; Bayesian symbolic methods; Generative Adversarial Networks (GANs); support vector machines; image registration methods; and applicable rule-based systems. Where regression algorithms are used, they may include but are not limited to: a Stochastic Gradient Descent Regressor, a Passive Aggressive Regressor, etc.

Machine learning classification models can also be based on clustering algorithms (e.g., a Mini-batch K-means clustering algorithm), a recommendation algorithm (e.g., a Min- wise Hashing algorithm, or Euclidean Locality-Sensitive Hashing (LSH) algorithm), and/or an anomaly detection algorithm, such as a local outlier factor. Additionally, machine-learning models can employ a dimensionality reduction approach, such as, one or more of: a Mini-batch Dictionary Learning algorithm, an incremental Principal Component Analysis (PCA) algorithm, a Latent Dirichlet Allocation algorithm, and/or a Mini-batch K-means algorithm, etc.

Figure 7:
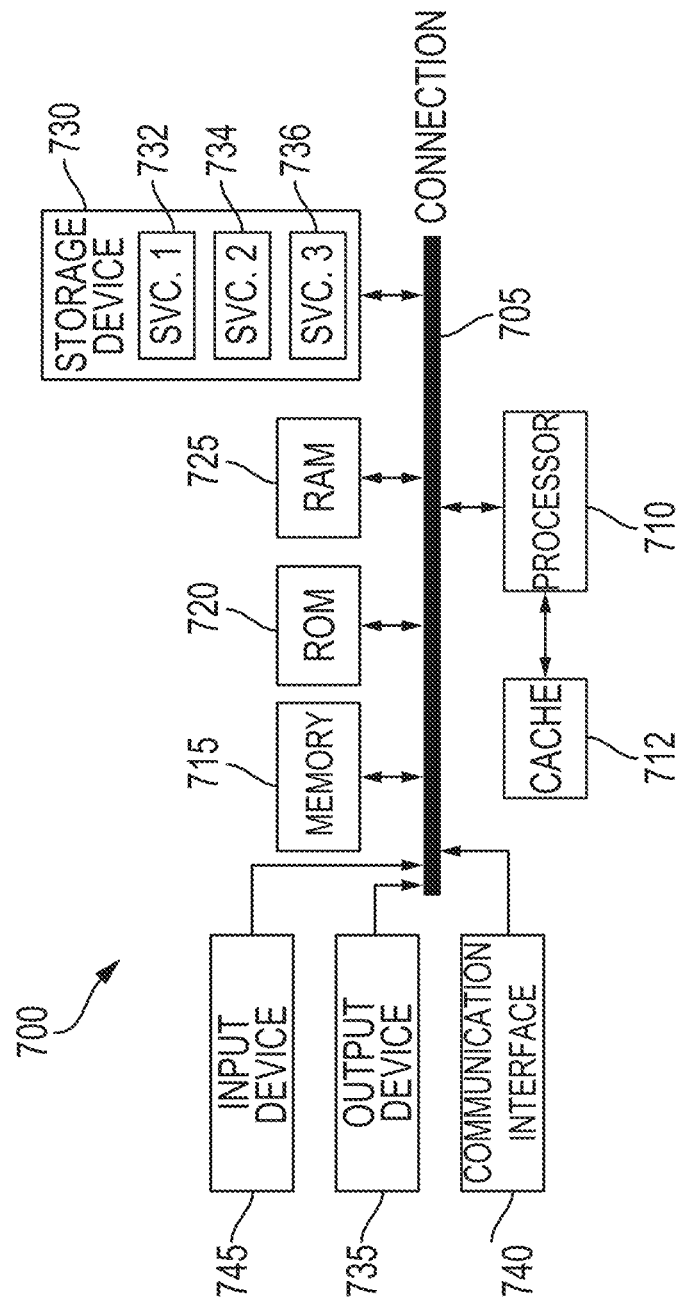
FIG. 7 illustrates an example computing device architecture which can be employed to perform various steps, methods, and techniques disclosed herein.

FIG. 7 illustrates an example computing device architecture 700 which can be employed to perform various steps, methods, and techniques disclosed herein. The various implementations will be apparent to those of ordinary skill in the art when practicing the present technology. Persons of ordinary skill in the art will also readily appreciate that other system implementations or examples are possible.

As noted above, FIG. 7 illustrates an example computing device architecture 700 of a computing device which can implement the various technologies and techniques described herein. For example, the components of the computing device architecture 700 are shown in electrical communication with each other using a connection 705, such as a bus. The example computing device architecture 700 includes a processing unit (CPU or processor) 710 and a computing device connection 705 that couples various computing device components including the computing device memory 715, such as read only memory (ROM) 720 and random access memory (RAM) 725, to the processor 710.

The computing device architecture 700 can include a cache of high-speed memory connected directly with, in close proximity to, or integrated as part of the processor 710. The computing device architecture 700 can copy data from the memory 715 and/or the storage device 730 to the cache 712 for quick access by the processor 710. In this way, the cache can provide a performance boost that avoids processor 710 delays while waiting for data. These and other modules can control or be configured to control the processor 710 to perform various actions. Other computing device memory 715 may be available for use as well. The memory 715 can include multiple different types of memory with different performance characteristics. The processor 710 can include any general purpose processor and a hardware or software service, such as service 1 732, service 2 734, and service 3 736 stored in storage device 730, configured to control the processor 710 as well as a special-purpose processor where software instructions are incorporated into the processor design. The processor 710 may be a self-contained system, containing multiple cores or processors, a bus, memory controller, cache, etc. A multi-core processor may be symmetric or asymmetric.

To enable user interaction with the computing device architecture 700, an input device 745 can represent any number of input mechanisms, such as a microphone for speech, a touch-sensitive screen for gesture input, keyboard, mouse, motion input, speech and so forth. An output device 735 can also be one or more of a number of output mechanisms known to those of skill in the art, such as a display, projector, television, speaker device, etc. In some instances, multimodal computing devices can enable a user to provide multiple types of input to communicate with the computing device architecture 700. The communications interface 740 can generally govern and manage the user input and computing device output. There is no restriction on operating on any particular hardware arrangement and therefore the basic features here may easily be substituted for improved hardware or firmware arrangements as they are developed.

Storage device 730 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 725, read only memory (ROM) 720, and hybrids thereof. The storage device 730 can include services 732, 734, 736 for controlling the processor 710. Other hardware or software modules are contemplated. The storage device 730 can be connected to the computing device connection 705. In one aspect, a hardware module that performs a particular function can include the software component stored in a computer-readable medium in connection with the necessary hardware components, such as the processor 710, connection 705, output device 735, and so forth, to carry out the function.

For clarity of explanation, in some instances the present technology may be presented as including individual functional blocks including functional blocks comprising devices, device components, steps or routines in a method embodied in software, or combinations of hardware and software.

In some examples, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can include, for example, instructions and data which cause or otherwise configure a general purpose computer, special purpose computer, or a processing device to perform a certain function or group of functions. Portions of computer resources used can be accessible over a network. The computer executable instructions may be, for example, binaries, intermediate format instructions such as assembly language, firmware, source code, etc. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can include hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are example means for providing the functions described in the disclosure.

In the foregoing description, aspects of the application are described with reference to specific examples thereof, but those skilled in the art will recognize that the application is not limited thereto. Thus, while illustrative examples of the application have been described in detail herein, it is to be understood that the disclosed concepts may be otherwise variously embodied and employed, and that the appended claims are intended to be construed to include such variations, except as limited by the prior art. Various features and aspects of the above-described subject matter may be used individually or jointly. Further, examples and aspects can be utilized in any number of environments and applications beyond those described herein without departing from the broader spirit and scope of the specification. The specification and drawings are, accordingly, to be regarded as illustrative rather than restrictive. For the purposes of illustration, methods were described in a particular order. It should be appreciated that in alternate examples and aspects, the methods may be performed in a different order than that described.

Where components are described as being "configured to" perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof.

The various illustrative logical blocks, modules, circuits, and algorithm steps described in connection with the examples disclosed herein may be implemented as electronic hardware, computer software, firmware, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present application.

The techniques described herein may also be implemented in electronic hardware, computer software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the method, algorithms, and/or operations described above. The computer-readable data storage medium may form part of a computer program product, which may include packaging materials.

The computer-readable medium may include memory or data storage media, such as random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

Other examples and aspects of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Examples and aspects may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

In the above description, terms such as "upper," "upward," "lower," "downward," "above," "below," "downhole," "uphole," "longitudinal," "lateral," and the like, as used herein, shall mean in relation to the bottom or furthest extent of the surrounding wellbore even though the wellbore or portions of it may be deviated or horizontal. Correspondingly, the transverse, axial, lateral, longitudinal, radial, etc., orientations shall mean orientations relative to the orientation of the wellbore or tool. Additionally, the illustrate examples and aspects are illustrated such that the orientation is such that the right-hand side is downhole compared to the left-hand side.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or another word that substantially modifies, such that the component need not be exact. For example, substantially cylindrical means that the object resembles a cylinder, but can have one or more deviations from a true cylinder.

The term "radially" means substantially in a direction along a radius of the object, or having a directional component in a direction along a radius of the object, even if the object is not exactly circular or cylindrical. The term "axially" means substantially along a direction of the axis of the object. If not specified, the term axially is such that it refers to the longer axis of the object.

Although a variety of information was used to explain aspects within the scope of the appended claims, no limitation of the claims should be implied based on particular features or arrangements, as one of ordinary skill would be able to derive a wide variety of implementations. Further and although some subject matter may have been described in language specific to structural features and/or method steps, it is to be understood that the subject matter defined in the appended claims is not necessarily limited to these described features or acts. Such functionality can be distributed differently or performed in components other than those identified herein. The described features and steps are disclosed as possible components of systems and methods within the scope of the appended claims.

Moreover, claim language reciting "at least one of" a set indicates that one member of the set or multiple members of the set satisfy the claim. For example, claim language reciting "at least one of A and B" means A, B, or A and B.

Statements of the disclosure include:

Statement 1. A method comprising: receiving magnetic flux leakage data obtained by a magnetic flux leakage tool placed in a pipe within a wellbore; converting the magnetic flux leakage data into image data; and providing the image data to a machine learning model, wherein the machine learning model is configured to identify one or more physical parameters associated with corrosion present on the pipe.

Statement 2. The method of statement 1, further comprising: outputting, via the machine learning model with the image data as input, the one or more physical parameters associated with the corrosion.

Statement 3. The method of statements 1 and 2, wherein the one or more physical parameters associated with the corrosion include a defect circumferential width, a defect axial length, a detect penetration, a volume of metal loss, and a combination thereof.

Statement 4. The method of statement 3, further comprising: providing the one or more physical parameters outputted by the machine learning model into a second machine learning model to identify a second physical parameter associated with the corrosion.

Statement 5. The method of statements 1 through 4, wherein providing the image data to the machine learning model includes: identifying at least one anomaly in the image data; determining one or more features associated with the at least one anomaly; and providing the one or more features associated with the at least one anomaly to the machine learning model.

Statement 6. The method of statement 5, wherein the one or more features associated with the at least one anomaly include at least one of an anomaly circumferential width, an anomaly axial length, a peak deflection from a baseline, width and length in a percentile, mean deflection from a baseline, and an anomaly contour length.

Statement 7. The method of statements 1 through 6, further comprising: providing measurement parameters to the machine learning model, wherein the measurement parameters include at least one of an inner indicator, an outer indicator, a logging direction, an outside diameter (OD) of the pipe, an inside diameter (ID) of the pipe, a logging speed, and an eccentricity between the pipe and another outer pipe.

Statement 8. The method of statements 1 through 7, wherein the machine learning model is a regression model.

Statement 9. The method of statements 1 through 8, wherein the magnetic flux leakage tool comprises a magnet configured to magnetize the pipe and one or more magnetic field sensors disposed along a circumference of the pipe and configured to measure flux leakage.

Statement 10. The method of statements 1 through 9, wherein the magnetic flux leakage tool comprises a magnet configured to at least partially saturate the pipe and one or more eddy current sensors disposed along a circumference of the pipe and configured to measure secondary magnetic fields generated by eddy currents.

Statement 11. The method of statements 1 through 10, wherein the image data is a 2-dimensional measurement of a circumference of the pipe with respect to a measured depth of the pipe.

Statement 12. The method of statements 1 through 11, wherein the machine learning model comprises a plurality of machine learning models, wherein each of the plurality of machine learning models is configured to identify one of the one or more physical parameters associated with the corrosion.

Statement 13. The method of statements 1 through 12, wherein the machine learning model is trained with training data including at least one of data obtained through logging a test fixture, simulation data from a test fixture, and data obtained through logging a field log.

Statement 14. A system comprising: a memory; and one or more processors coupled to the memory, the one or more processors being configured to: receive magnetic flux leakage data obtained by a magnetic flux leakage (MFL) tool placed in a pipe within a wellbore; convert the magnetic flux leakage data into image data; and provide the image data to a machine learning model, wherein the machine learning model is configured to identify one or more physical parameters associated with corrosion present on the pipe.

Statement 15. The system of statement 14, wherein the one or more processors are configured to: output, via the machine learning model with the image data as input, the one or more physical parameters associated with the corrosion.

Statement 16. The system of statements 14 and 15, wherein the one or more physical parameters associated with the corrosion present in the pipe include a defect circumferential width, a defect axial length, a detect penetration, a volume of metal loss, and a combination thereof.

Statement 17. The system of statements 14 through 16, wherein providing the image data to the machine learning model includes: identifying at least one anomaly in the image data; determining one or more features associated with the at least one anomaly; and providing the one or more features associated with the at least one anomaly to the machine learning model.

Statement 18. The system of statement 17, wherein the one or more features associated with the at least one anomaly include at least one of an anomaly circumferential width, an anomaly axial length, a peak deflection from a baseline, width and length in a percentile, mean deflection from a baseline, and an anomaly contour length.

Statement 19. The system of statements 14 through 18, wherein the one or more processors are configured to: provide measurement parameters to the machine learning model, wherein the measurement parameters include at least one of an inner indicator, an outer indicator, a logging direction, an outside diameter (OD) of the pipe, an inside diameter (ID) of the pipe, a logging speed, and an eccentricity between the pipe and another outer pipe.

Statement 20. A non-transitory computer-readable medium having stored thereon instructions which, when executed by one or more processors, cause the one or more processors to perform operations in accordance with any one of statements 1 to 13.

Statement 21. A system comprising means for performing a method according to any of statements 1 to 13.

What is claimed is:

1. A method comprising:
   disposing a magnetic flux leakage tool in a pipe within a wellbore;
   operating the magnetic flux leakage tool to generate magnetic flux leakage data for the pipe within the wellbore;
   converting the magnetic flux leakage data into image data;
   providing the image data to a machine learning model;
   identifying, by applying the machine learning model to the image data, one or more physical parameters associated with corrosion present on the pipe.

2. The method of claim 1, further comprising:
   outputting, via the machine learning model with the image data as input, the one or more physical parameters associated with the corrosion.

3. The method of claim 1, wherein the one or more physical parameters associated with the corrosion include a defect circumferential width, a defect axial length, a detect penetration, a volume of metal loss, and a combination thereof.

4. The method of claim 3, further comprising:
   providing the one or more physical parameters outputted by the machine learning model into a second machine learning model to identify a second physical parameter associated with the corrosion.

5. The method of claim 1, wherein providing the image data to the machine learning model includes:
   identifying at least one anomaly in the image data;
   determining one or more features associated with the at least one anomaly; and
   providing the one or more features associated with the at least one anomaly to the machine learning model.

6. The method of claim 5, wherein the one or more features associated with the at least one anomaly include at least one of an anomaly circumferential width, an anomaly axial length, a peak deflection from a baseline, mean deflection from a baseline, width and length in a percentile, and an anomaly contour length.

7. The method of claim 1, further comprising:
   providing measurement parameters to the machine learning model, wherein the measurement parameters include at least one of an inner indicator, an outer indicator, a logging direction, an outside diameter (OD) of the pipe, an inside diameter (ID) of the pipe, a logging speed, and an eccentricity between the pipe and another outer pipe.

8. The method of claim 1, wherein the machine learning model is a regression model.

9. The method of claim 1, wherein the magnetic flux leakage tool comprises a magnet configured to magnetize the pipe and one or more magnetic field sensors disposed along a circumference of the pipe and configured to measure flux leakage.

10. The method of claim 1, wherein the magnetic flux leakage tool comprises a magnet configured to at least partially saturate the pipe and one or more eddy current sensors disposed along a circumference of the pipe and configured to measure secondary magnetic fields generated by eddy currents.

11. The method of claim 1, wherein the image data is a 2-dimensional measurement of a circumference of the pipe with respect to a measured depth of the pipe.

12. The method of claim 1, wherein the machine learning model comprises a plurality of machine learning models, wherein each of the plurality of machine learning models is configured to identify one of the one or more physical parameters associated with the corrosion.

13. The method of claim 1, wherein the machine learning model is trained with training data including at least one of data obtained through logging a test fixture, simulation data from a test fixture, and data obtained through logging a field log.

14. A system comprising:
one or more sensors of a magnetic flux leakage (MFL) tool configured to receive magnetic flux leakage data when the MFL tool is disposed and operating downhole within a wellbore
a memory; and
one or more processors coupled to the memory, the one or more processors being configured to:
receive the magnetic flux leakage data obtained by the MFL tool placed in a pipe within the wellbore;
convert the magnetic flux leakage data into image data;
provide the image data to a machine learning model;
identify, by applying the machine learning model to the image data, one or more physical parameters associated with corrosion present on the pipe.

15. The system of claim 14, wherein the one or more processors are configured to:
output, via the machine learning model with the image data as input, the one or more physical parameters associated with the corrosion.

16. The system of claim 14, wherein the one or more physical parameters associated with the corrosion present in the pipe include a defect circumferential width, a defect axial length, a detect penetration, a volume of metal loss, and a combination thereof.

17. The system of claim 14, wherein providing the image data to the machine learning model includes:
identifying at least one anomaly in the image data;
determining one or more features associated with the at least one anomaly; and providing the one or more features associated with the at least one anomaly to the machine learning model.

18. The system of claim 17, wherein the one or more features associated with the at least one anomaly include at least one of an anomaly circumferential width, an anomaly axial length, a peak deflection from a baseline, mean deflection from a baseline, width and length in a percentile, and an anomaly contour length.

19. The system of claim 14, wherein the one or more processors are configured to:
provide measurement parameters to the machine learning model, wherein the measurement parameters include at least one of an inner indicator, an outer indicator, a logging direction, an outside diameter (OD) of the pipe, an inside diameter (ID) of the pipe, a logging speed, and an eccentricity between the pipe and another outer pipe.

20. The system of claim 14, wherein the machine learning model is a regression model.

* * * * *